US012690397B2

(12) United States Patent
Lung

(10) Patent No.: US 12,690,397 B2
(45) Date of Patent: Jul. 21, 2026

(54) VERTICAL 3D CROSS POINT MEMORY

(71) Applicant: MACRONIX INTERNATIONAL CO., LTD., Hsinchu (TW)

(72) Inventor: Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 658 days.

(21) Appl. No.: 18/207,839

(22) Filed: Jun. 9, 2023

(65) Prior Publication Data

US 2024/0147877 A1 May 2, 2024

Related U.S. Application Data

(60) Provisional application No. 63/421,586, filed on Nov. 2, 2022.

(51) Int. Cl.
*H10N 70/00* (2023.01)
*H10B 63/00* (2023.01)

(52) U.S. Cl.
CPC ........... *H10N 70/882* (2023.02); *H10B 63/24* (2023.02); *H10B 63/845* (2023.02); *H10N 70/021* (2023.02); *H10N 70/826* (2023.02); *H10N 70/841* (2023.02)

(58) Field of Classification Search
CPC .... H10B 63/24; H10B 63/845; H10N 70/021; H10N 70/826
See application file for complete search history.

(56) References Cited

U.S. PATENT DOCUMENTS

| | | | |
|---|---|---|---|
| 8,415,651 | B2 | 4/2013 | Lung |
| 8,841,649 | B2 | 9/2014 | Pio |
| 9,613,689 | B1 | 4/2017 | Takaki |
| 9,947,721 | B2 | 4/2018 | Fantini |
| 10,461,125 | B2 | 10/2019 | Pirovano et al. |
| 10,658,588 | B2 | 5/2020 | Yasuda et al. |
| 10,782,891 | B1 | 9/2020 | Martin et al. |
| 10,796,757 | B1 | 10/2020 | Nakazawa |
| 10,847,578 | B1 | 11/2020 | Chen |
| 11,424,260 | B2 | 8/2022 | Lai et al. |
| 11,871,588 | B2 | 1/2024 | Lee et al. |
| 2012/0248399 | A1 | 10/2012 | Sasago et al. |
| 2013/0229846 | A1 | 9/2013 | Chien et al. |
| 2014/0291603 | A1 | 10/2014 | Song |
| 2018/0159030 | A1 | 6/2018 | Park |

(Continued)

FOREIGN PATENT DOCUMENTS

| | | |
|---|---|---|
| JP | 2020516057 A | 5/2020 |
| JP | 2020149736 A | 9/2020 |

(Continued)

OTHER PUBLICATIONS

JP Office Action with English Translation from Application No. 2023-135804, dated Oct. 1, 2024, 10 pages.

(Continued)

*Primary Examiner* — Marvin Payen
(74) *Attorney, Agent, or Firm* — Korbin S Van Dyke; Haynes Beffel & Wolfeld LLP

(57) ABSTRACT

Vertical 3D cross point memory has memory cells formed at cross points of vertical bit lines and horizontal word lines. The memory cells are formed of two layers, enabling higher density than conventional techniques. One of the layers optionally includes OTS (Ovonic Threshold Switch) material to enable information storage.

20 Claims, 13 Drawing Sheets

(56) References Cited

U.S. PATENT DOCUMENTS

| | | |
|---|---|---|
| 2019/0067371 A1 | 2/2019 | Pirovano et al. |
| 2019/0172502 A1 | 6/2019 | Jeong et al. |
| 2020/0052204 A1 | 2/2020 | Park |
| 2020/0294584 A1 | 9/2020 | Al-Shamma et al. |
| 2021/0249598 A1 | 8/2021 | Zheng et al. |
| 2022/0235291 A1 | 7/2022 | Vinther et al. |

FOREIGN PATENT DOCUMENTS

| | | |
|---|---|---|
| JP | 2022532863 A | 7/2022 |
| KR | 1020200028032 | 3/2020 |
| KR | 1020210087092 | 7/2021 |
| TW | 201001679 A | 1/2010 |
| TW | 201737434 A | 10/2017 |
| TW | 202103302 A | 1/2021 |
| TW | 202249242 A | 12/2022 |
| TW | 202308128 A | 2/2023 |

OTHER PUBLICATIONS

Jang et al., "Vertical Cell Array Using TCAT (Terabit Cell Array Transistor) Technology for Ultra High Density NAND Flash Memory," 2009 Symp. on VLSI Technology, Jun. 16-18, 2009, 2 pages.
Micheloni et al., "Architectural and Integration Options for 3D NAND Flash Memories," Computers 2017, Aug. 10, 2017, 20 pages.
KR Office Action English Translation from KR Application No. 10-2023-0122720 dated Oct. 10, 2024, 18 pages.

Left Electrode, 120L

Right Electrode, 120R

Center Electrode, 120C

Group of Unit Cells, 104

Left Cell, 110L

Right Cell, 110R

Z Y X

Center Electrode, 120C

Z Y X

Stack of Unit Cells, 103

VERTICAL 3D CROSS POINT MEMORY

PRIORITY APPLICATION

This application claims the benefit of and incorporates by reference herein for all purposes U.S. Provisional Patent Application No. 63/421,586 filed 2 Nov. 2022.

BACKGROUND

Field

This disclosure relates to memory cells, including memory cells used in integrated circuits.

Description of Related Art

In memory cells used in integrated circuits, it is useful to provide low latency, lower power, low cost, and high density, all in combination. Existing implementations of memory cells are lacking in one or more of the foregoing characteristics.

SUMMARY

A system of one or more computers are configurable to perform particular operations or actions by virtue of having software, firmware, hardware, or a combination thereof installed on the system that in operation cause the system to perform and/or control the actions. One or more computer programs are configurable to perform particular operations or actions by virtue of including instructions that, when executed by data processing apparatus, cause the apparatus to perform the actions.

A first aspect includes a memory device. The memory device includes a center electrode; a stack of layers having an internal sidewall that defines a hole that accommodates the center electrode; and where the stack of layers includes active layers, where each of the active layers includes a left electrode, a controllable conduction element, and a right electrode, and where at least a portion of the controllable conduction element is in electrical series between (i) the left electrode and the center electrode and (ii) the right electrode and the center electrode.

Variations optionally include one or more of the following features, alone or in any combination.

The stack of layers further includes one or more separating layers; and the active layers are separated from each other by at least one of the separating layers. The center electrode is a first center electrode; the memory device further includes a second center electrode; the internal sidewall is a first internal sidewall, the hole is a first hole, and the stack of layers has a second internal sidewall that defines a second hole that accommodates the second center electrode; and the at least the portion of the controllable conduction element is in electrical series between (i) the left electrode and the second center electrode and (ii) the right electrode and the second center electrode. The memory device where there are at least three of the active layers. The stack of layers is a first stack of layers; the memory device further includes a second stack of layers like the first stack of layers; and the first and the second stacks of layers are physically separated from each other. The layers of the first and second stacks of layers are parallel to each other; and a major axis of the first center electrode and a major axis of the second center electrode are orthogonal to a plane that the layers of the first and second stacks of layers are parallel with. The controllable conduction elements include Ovonic Threshold Switch (OTS) material; the left electrodes and the right electrodes include a first conductive material; and the center electrode includes a second conductive material. The left electrodes and the right electrodes are collectively side electrodes that include respective conductive portions that include a first conductive material; the center electrode includes a conductive portion that includes a second conductive material; the side electrodes and the center electrode are collectively memory electrodes; at least one of the memory electrodes includes a buffer portion that includes a buffer material; and the buffer portion of the at least one memory electrode is disposed between the conductive portion of the at least one memory electrode and at least one of the controllable conduction elements. The hole has a particular one of a plurality of cross sections parallel to a plane that the layers of the stack of layers are parallel with; and the plurality of cross sections includes at least one of a circular cross section, an elliptical cross section, and a rectangular cross section. The stack of layers includes two like stacks of layers having major axes parallel to each other, and each of the two like stacks of layers have respective pluralities of center electrodes that include the center electrode of the respective like stack of layers; the two like stacks of layers are physically separated from each other; the plurality of center electrodes of a first of the two like stacks of layers is offset along the major axis of the first of the two like stacks of layers with respect to the plurality of center electrodes of a second of the two like stacks of layers. The left electrodes and the right electrodes are collectively each operable as a respective word line of a memory array; the center electrode is operable as a bit line of the memory array; and the controllable conduction elements are usable as non-volatile storage to store portions of information of the memory array, the information is resolvable to one or more bits of binary information, and is accessible via activation of one of the word lines in conjunction with operation of the bit line.

A second aspect includes a method of forming a memory device. The method includes forming a stack of layers, the stack of layers including alternating active layers and separating layers; and forming a conductive center electrode vertically extending through the stack of layers, where the forming the stack of layers includes forming each of the active layers by: forming a layer of controllable conduction material; forming a pair of parallel undercuts in the layer of controllable conduction material; and forming a pair of conductive side electrodes to fill the parallel undercuts and where the conductive side electrodes are separated from the conductive center electrode by at least a portion of the layer of controllable conduction material.

Variations optionally include one or more of the following features, alone or in any combination. The conductive center electrode is a first conductive center electrode; the method further includes forming a second conductive center electrode vertically extending through the stack of layers; and each pair of the conductive side electrodes is separated from the second conductive center electrode by at least a portion of the layer of controllable conduction material. The method further includes forming a plurality of vertical slits extending through the stack of layers, and the vertical slits are parallel to each other. The forming the conductive center electrode includes forming a buffer structure disposed between the conductive center electrode and the layer of controllable conduction material. The forming the pair of conductive side electrodes includes forming a buffer structure disposed between at least one of the conductive side electrodes and the layer of controllable conduction material.

The conductive center electrode has a particular one of a plurality of cross sections parallel to a plane that the layers of the stack of layers are parallel with; and the plurality of cross sections includes at least one of a circular cross section, an elliptical cross section, and a rectangular cross section. The conductive center electrodes of the plurality of conductive center electrodes are arranged in alternating columns offset from each other by a predetermined offset. The layer of controllable conduction material includes Ovonic Threshold Switch (OTS) material.

A third aspect includes a processor and a memory enabled to store instructions executable by the processor that when executed by the processor cause the processor to perform operations. The operations include forming a stack of layers, the stack of layers including alternating active layers and separating layers; and forming a conductive center electrode vertically extending through the stack of layers, where the forming the stack of layers includes forming each of the active layers by: forming a layer of controllable conduction material; forming a pair of parallel undercuts in the layer of controllable conduction material; and forming a pair of conductive side electrodes to fill the parallel undercuts and where the conductive side electrodes are separated from the conductive center electrode by at least a portion of the layer of controllable conduction material.

Variations of the foregoing aspects optionally include hardware, a method or process, or computer software on a computer-accessible medium.

Other aspects and advantages of this disclosure are apparent from the drawings, the detailed description, and the claims.

DETAILED DESCRIPTION

Figures 1A, 1B:
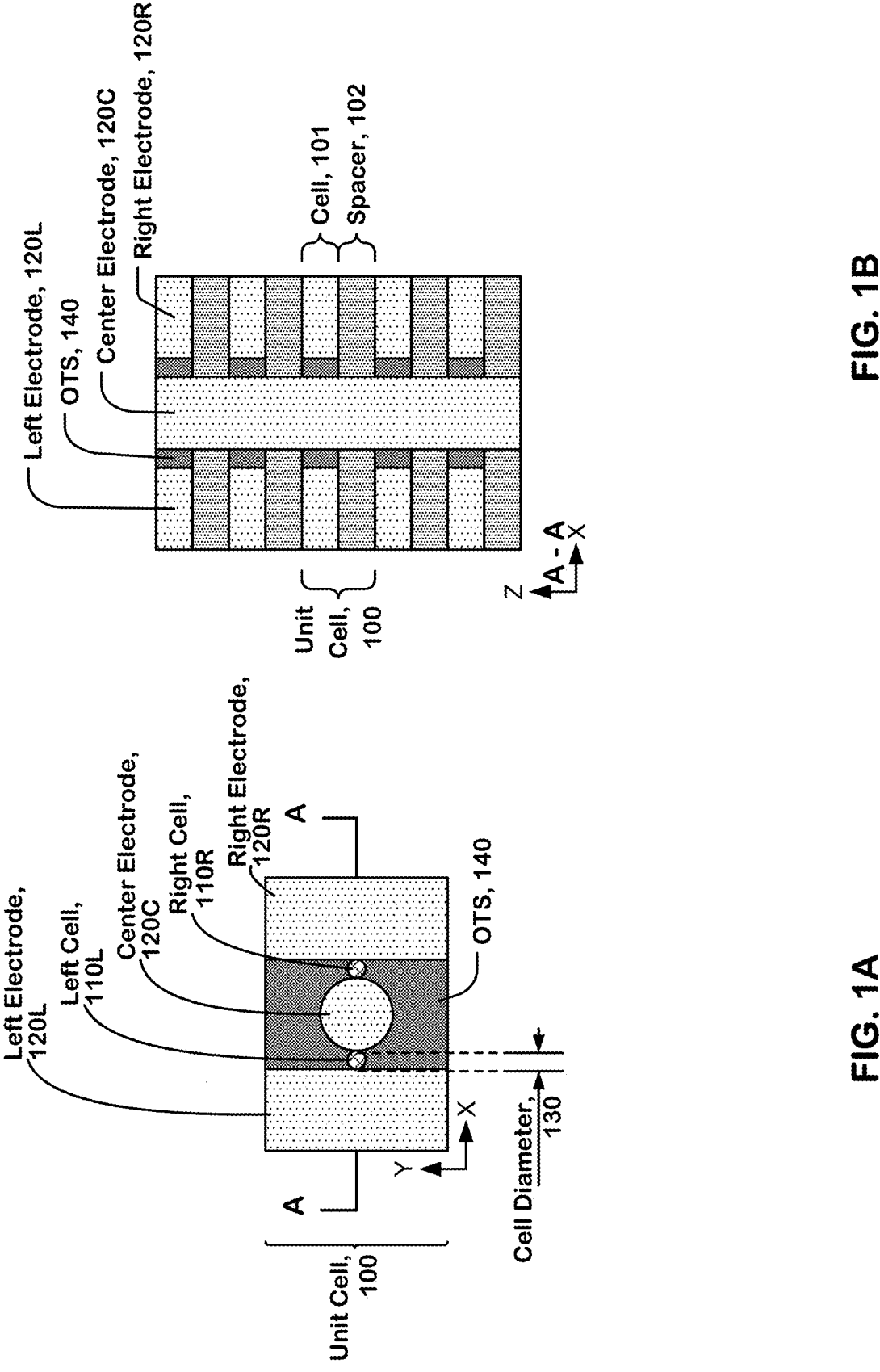
FIGS. 1A, 1B, 1C, 1D, and 1E illustrate various aspects of memory cells of a vertical 3D cross point memory.

A detailed description of techniques relating to vertical 3D cross point memory are provided with reference to FIGS. 1A-14.

One or more flow diagrams are described herein. Processing described by the flow diagrams is implementable and/or directable using processors programmed using computer programs stored in memory accessible to computer systems and executable by the processors, using dedicated logic hardware (including field programmable integrated circuits), and using various combinations thereof. Various actions are combinable, performable in parallel, and/or performable in a different sequence without affecting processing achieved. In some cases, a rearrangement of actions achieves identical results only if certain other changes are made as well. In other cases, a rearrangement of actions achieves identical results only if certain conditions are satisfied. Furthermore, for clarity, some of the flow diagrams herein omit certain some actions not necessary for understanding the disclosed techniques. Various additional actions are performable before, after, and/or between the illustrated actions.

Examples of selected acronyms, mnemonics, and abbreviations used in the description are as follows.

| Acronym/Mnemonic/ Abbreviation | Example |
| --- | --- |
| 3D | three-dimensional |
| ALD | Atomic Layer Deposition |
| As | Arsenic |
| B | Boron |
| BL | Bit Line |
| C | Carbon |
| CMP | Chemical Metal Polishing |
| CVD | Chemical Vapor Deposition |
| CXL | Compute eXpress Link |
| DRAM | Dynamic Random Access Memory |
| Ge | Germanium |
| In | Indium |
| N | Nitrogen |
| NAND memory | Not AND (memory); e.g., series connection of devices forming a memory |
| NVDIMM | Non-Volatile Dual Inline Memory Module |
| O | Oxygen |
| OTS | Ovonic Threshold Switch |
| PCM | Phase Change Memory |
| RIE | Reactive Ion Etching |
| S | Sulfur |
| Sb | Antimony |
| SCM | Storage Class Memory |
| Se | Selenium |
| Si | Silicon |
| SONOS | Silicon-Oxide-Nitride-Oxide-Silicon |
| SSD | Solid State Drive |
| Ta | Tantalum |
| TaN | Tantalum Nitride |
| Te | Tellurium |
| Ti | Titanium |
| TiN | Titanium Nitride |
| W | Tungsten |
| WL | Word Line |

Vertical 3D Cross Point Memory Concepts

Vertical 3D cross point memory as described herein comprises structures to form memory cells enabled to retain information. The memory cells are formed at cross points (e.g., intersections) of orthogonal electrodes, such as bit lines and word lines. Intersection of bit line and word line selections activates an individual memory cell, such as a left or right cell of a pair of individual memory cells of a unit cell. Each memory cell is formed in two layers, including elements for accessing (reading and writing) as well as elements optionally included for erasing and/or programming.

The bit lines are constructed in a vertical (Z) dimension orthogonal to a planar wafer surface. The word lines are constructed in a first horizontal (Y) dimension parallel to the planar wafer surface. Replication of the memory cell elements is in three dimensions, (1) the first horizontal (Y) dimension, (2) a second horizontal (X) dimension, orthogonal to the first horizontal dimension and also parallel to the planar wafer surface, and (3) the vertical (Z) dimension.

Integrated circuit fabrication techniques, such as those based on planar processing of a silicon wafer, are usable to produce electronic devices comprising one or more vertical 3D cross point memories as described herein. Some variations of vertical 3D cross point memories are formed of memory cells enabled to retain information in absence of power. Thus, non-volatile storage is provided. Some variations of vertical 3D cross point memories are formed of memory cells enabled to retain information only with supplied power. Thus, volatile storage is provided.

Some vertical 3D cross point memories as described herein enable access latency competitive with DRAM (e.g., faster than 3D NAND-based memories) while also enabling density competitive with conventional 3D NAND-based memories (e.g., denser than DRAM). Some vertical 3D cross point memories as described herein enable cost reduction of memory fabrication compared to conventional memory fabrication techniques.

Figures 7A, 7B, 7C:
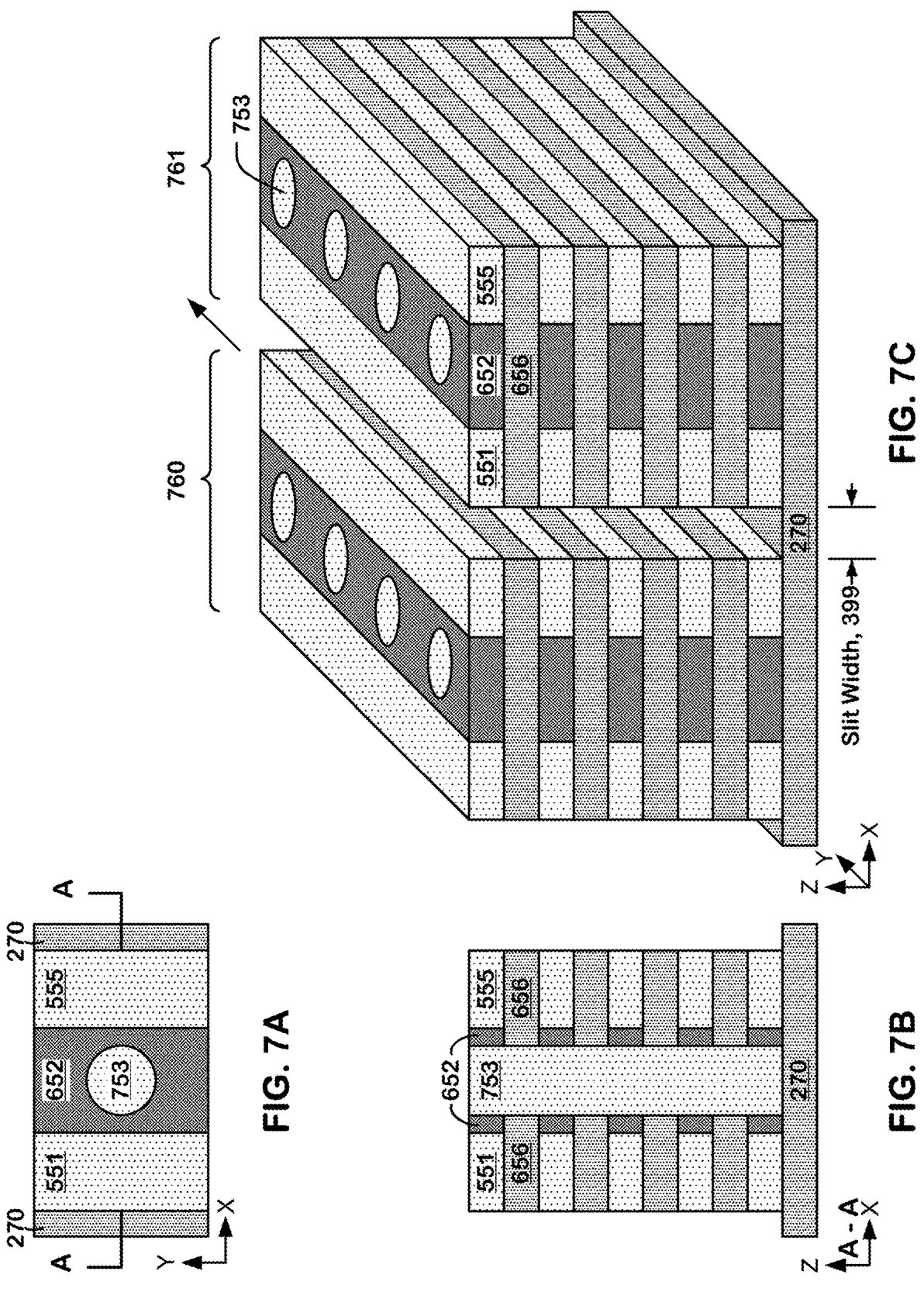

Throughout the description herein, as well as the associated figures, like-numbered elements correspond to identical elements, substantially similar elements, and/or instances thereof. For example, Unit Cell 100 of FIG. 1A is identical to Unit Cell 100 of FIG. 1B. Similarly, Separation (Base) Layer 270 of FIG. 7C is an instance of Separation (Base) Layer 270 of FIGS. 2B and 2C.

Throughout the figures, unless indicated otherwise, like-stippled elements correspond to elements comprised of identical or substantial identical types of materials, such as identical or substantially similar chemical compositions and/or structures. For example, stippling of OTS 140 of FIG. 1A is identical to that of OTS 140 of FIG. 1B and OTS Layer 252 of FIGS. 2A, 2B, and 2C, indicating that OTS 140, OTS 140, and OTS Layer 252 are of substantially similar materials, such as an OTS material based on Te.

Figures 1C, 1D:
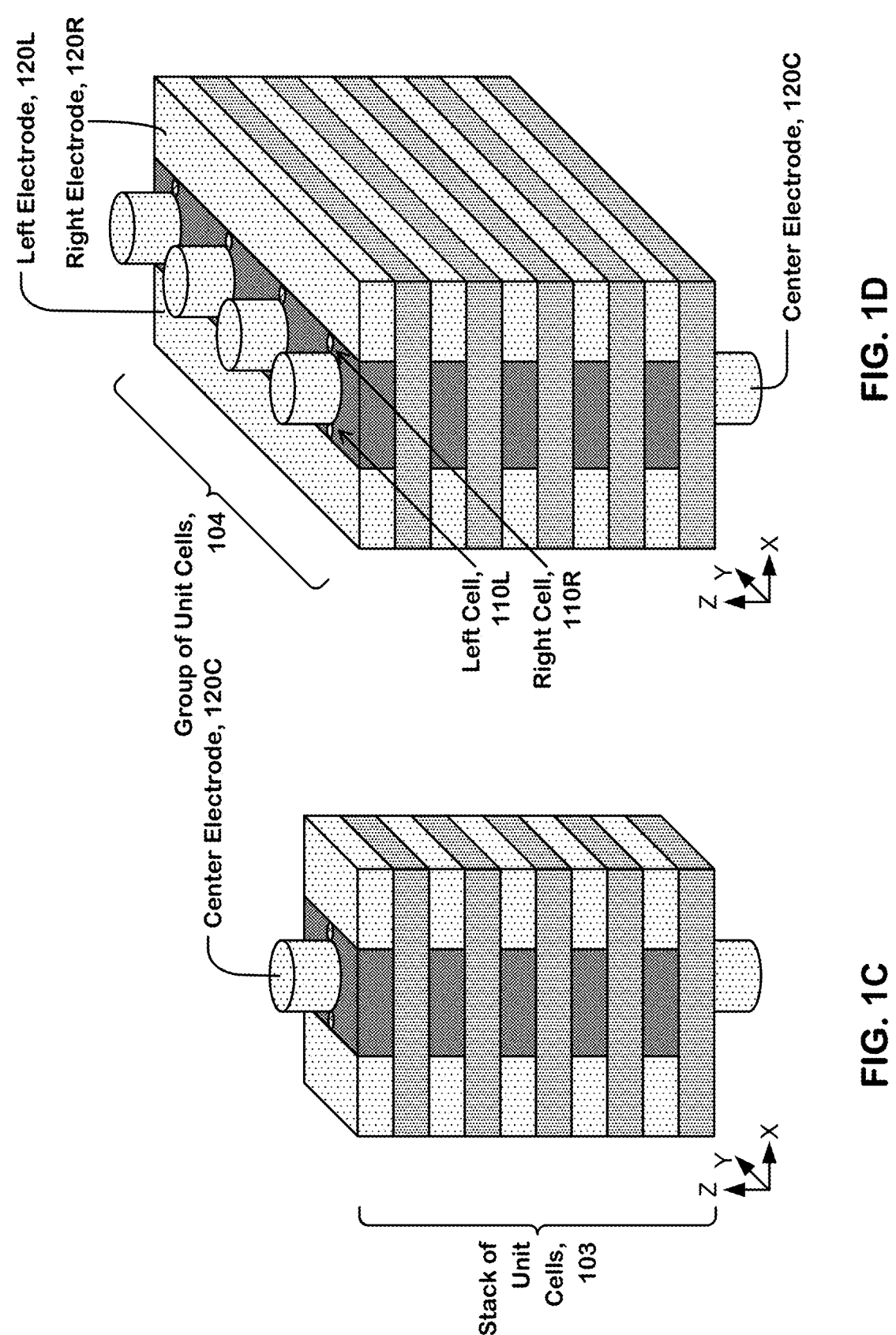
Figure 1E:
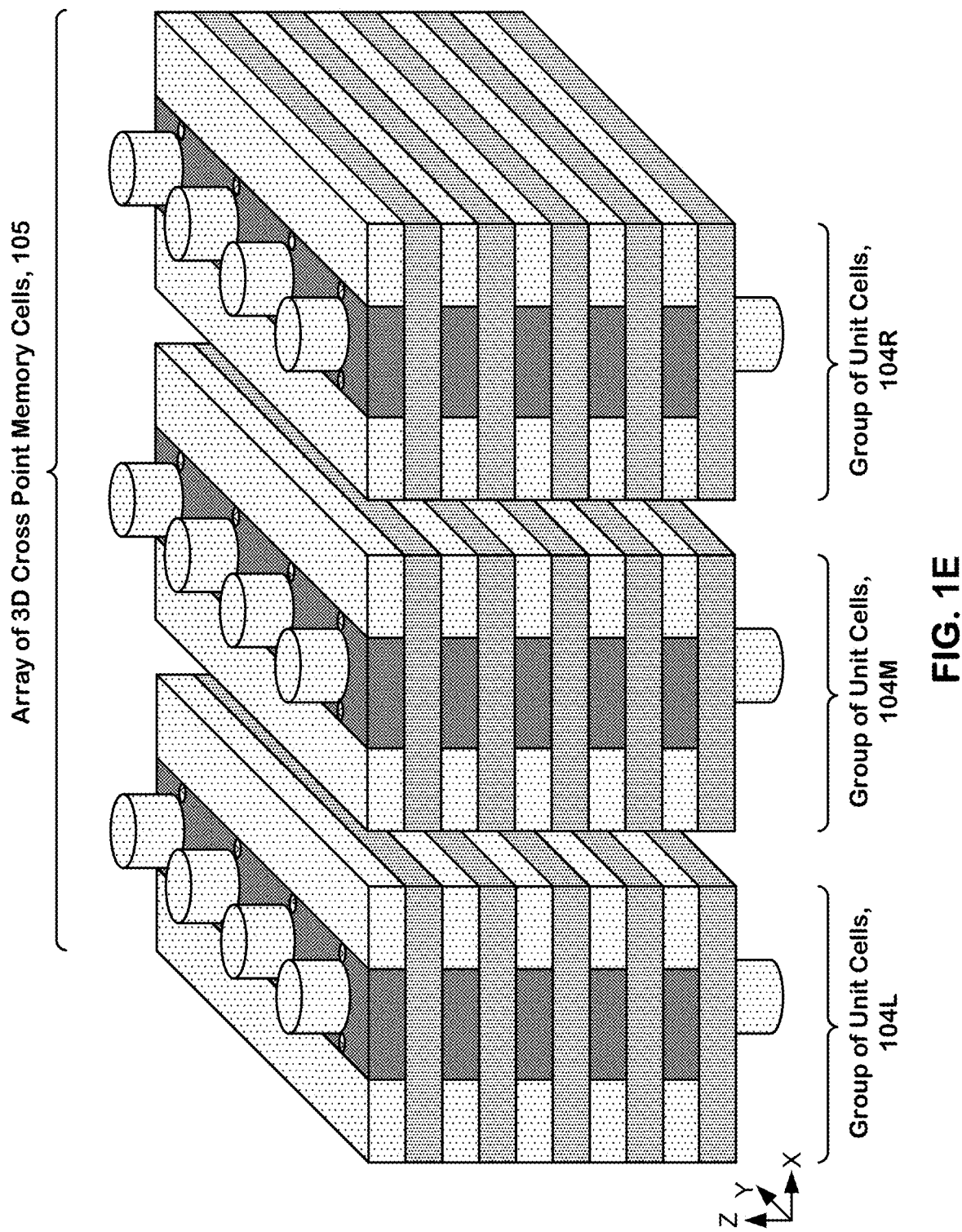

FIGS. 1A, 1B, 1C, 1D, and 1E illustrate various aspects of memory cells of a vertical 3D cross point memory. FIG. 1A illustrates a top view of a stack of individual single memory cells with the top cell being visible as Unit Cell 100. FIG. 1B illustrates a cross section view of elements of FIG. 1A along cross section A-A. FIG. 1C illustrates a 3D view corresponding to the elements of FIG. 1B. FIG. 1D illustrates a 3D view corresponding to a plurality of the elements of FIG. 1C. FIG. 1E illustrates a 3D view corresponding to a plurality of the elements of FIG. 1D.

For clarity of illustration, FIG. 1A illustrates a single unit cell as Unit Cell 100, FIG. 1C illustrates a stack of five-unit cells as Stack of Unit Cells 103, FIG. 1D illustrates a group of four of the stacks of five-unit cells as Group of Unit Cells 104, and FIG. 1E illustrates three sections of the groups of four. FIG. 1E illustrates the three sections as Array of 3D Cross Point Memory Cells 105, corresponding, in the illustrated example, to an array of 3D cross point memory cells of a vertical 3D cross point memory.

Conceptually, a unit cell is enabled to store a pair of symbols. Each symbol is accessible via a corresponding one of a pair of conductive side electrodes in conjunction with a conductive center electrode that is used for accesses of either of the symbols of the pair of symbols. More specifically, Unit Cell 100 is enabled to store two symbols, one in each of Left Cell 110L and Right Cell 110R. In an SLC technique, each of the symbols corresponds to a single bit of information. In an MLC technique, each of the symbols corresponds to more than one bit of information, such as two or more bits of information. Each of Left Cell 110L and Right Cell 110R are characterized according to Cell Diameter 130, for example, having a value of 15-20 nm. Information is accessed (e.g., read or written and/or optionally programmed/erased) via electrodes operated in conjunction with a controllable conduction element such as OTS 140. Left Electrode 120L in conjunction with Center Electrode 120C enables access of Left Cell 110L via OTS 140. Similarly, Right Electrode 120R in conjunction with Center Electrode 120C enables access of Right Cell 110R via OTS

140. In some cases, programming and/or erasing is further enabled by other mechanisms not specifically illustrated.

FIGS. 1A-1E illustrate a specific number of unit cells in a stack, a specific number of stacks in a group, and a specific number of groups in an array. Various other examples of vertical 3D cross point memories comprise various numbers of unit cells in a stack (such as 128- or 256-unit cells stacked), various numbers of unit cell stacks in a group (such as 128 or 256 stacks of unit cells), and various numbers of groups in an array (such as 128 or 256 groups of unit cells). There are no necessary relationships between the number of unit cells in a stack, the number of unit cell stacks in a group, and the number of groups in an array of 3D cross point memory cells. Thus, an exemplary array of 3D cross point memory cells comprises an array of stacks of 1024 unit cells in the Z dimension, groups of 2048 stacks in the Y dimension, and 4096 groups in the X dimension. The exemplary array is enabled to store 1024*2048*4096*2=2 MBytes total, using an SLC technique to store one bit per each of the left and right cells of a unit cell.

Unit Cell 100 corresponds to two layers, Cell 101 and Spacer 102. Cell 101 comprises electrode and controllable conduction element materials to enable storage of information. Spacer 102 serves to separate (e.g., electrically and/or thermally) instances of Cell 101 from one another when conceptually stacked in the Z dimension. Instances of Unit Cell 100 are conceptually replicated (e.g., stacked) in the Z dimension (vertically) to realize the vertical dimension of a vertical 3D cross point memory, such as Stack of Unit Cells 103 of FIG. 1C. All the unit cells of Stack of Unit Cells 103 share Center Electrode 120C for access.

Instances of Stack of Unit Cells 103 are conceptually replicated adjacently in the Y dimension, to realize a collection of unit cells such as Group of Unit Cells 104. Each respective layer of unit cells of the collection shares a respective pair of word lines, such as Left Electrode 120L (operated, e.g., as a left word line) and Right Electrode 120R (operated, e.g., as a right word line), respectively, for access. Thus, Left Electrode 120L, in conjunction with Center Electrode 120C (operated, e.g., as a bit line), enables access of the left cell of the unit cell at the physical juncture of Left Electrode 120L and Center Electrode 120C (such as an instance of Left Cell 110L of FIG. 1A as illustrated in FIG. 1D as Left Cell 110L). Similarly, Right Electrode 120R, in conjunction with Center Electrode 120C, enables access of a right cell of a unit cell (such as Right Cell 110R of FIG. 1A as illustrated in FIG. 1D as Right Cell 110R).

Instances of Group of Unit Cells 104 are conceptually replicated in the X dimension (with spacing), to realize an array of unit cells such as Array of 3D Cross Point Memory Cells 105. Each of the groups of unit cells (each of Group of Unit Cells (left) 104L, Group of Unit Cells (middle) 104M, and Group of Unit Cells (right) 104R, e.g., respective instances of Group of Unit Cells 104 of FIG. 1D) is enabled to operate either independently of others of the groups or in conjunction with others of the groups, as controllable by circuitry additional to Array of 3D Cross Point Memory Cells 105 (not illustrated).

Vertical 3D Cross Point Memory Example
Fabrication Structures

FIGS. 2A-7C illustrate time-sequence snapshots of an example of fabrication of a vertical 3D cross point memory array. The time-sequence proceeds monotonically in time, beginning with FIG. 2A and ending with FIG. 7C. Conceptually, FIGS. 2A-7C represent fabrication of collections of unit cells, such as Unit Cell 100 of FIGS. 1A and 1B.

The completed vertical 3D cross point memory array of FIGS. 7A-7C has stacks of five-unit cells arranged in two groups of four stacks each. The number and arrangement of the unit cells, stacks of unit cells, and groups of stacks is illustrative only. Other numbers and arrangements are fabricated in various cases.

Throughout FIGS. 2A-7C, the example vertical 3D cross point memory fabrication is illustrated as corresponding top (FIGS. 2A, 3A, 4A, 5A, 6A, and 7A), cross section (FIGS. 2B, 3B, 4B, 5B, 6B, and 7B), and 3D (FIGS. 2C, 3C, 4C, 5C, 6C, and 7C) views.

Figures 2A, 2B, 2C:
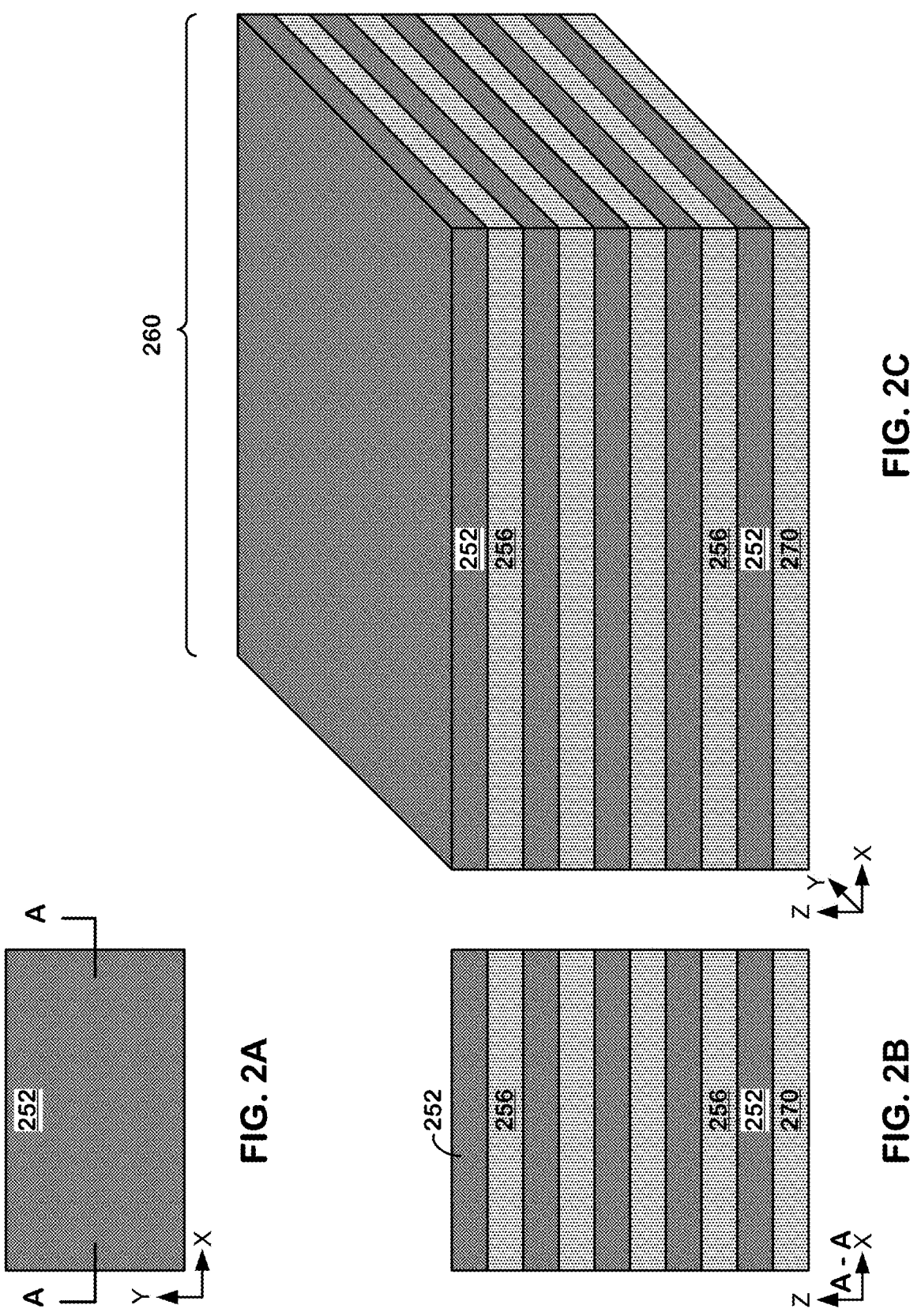
FIGS. 2A, 2B, 2C, 3A, 3B, 3C, 4A, 4B, 4C, 5A, 5B, 5C, 6A, 6B, 6C, 7A, 7B, and 7C illustrate time-sequence snapshots of an example of fabrication of a vertical 3D cross point memory array.

FIGS. 2A-2C illustrate various aspects of thin film depositions of two alternating planar layers of materials that are then further processed (as illustrated in FIGS. 3A-7C) to form a plurality of vertical 3D cross point memory elements. FIG. 2A illustrates a top view of the thin film depositions. FIG. 2B illustrates a cross section view of elements of FIG. 2A along cross section A-A. FIG. 2C illustrates a 3D view corresponding to the elements of FIG. 2B as Deposited Layer Stack 260.

In the top view, the entirety of OTS Layer 252 is visible, obscuring layers below.

In the cross section and 3D views, alternating active (OTS Layer 252) and separating (Separation Layer 256) layers are visible.

Separation (Base) Layer 270 serves as a base for deposition of layers above. Optionally, Separation (Base) Layer 270 is a top portion of a substrate such as a silicon-based wafer.

Figure 9:
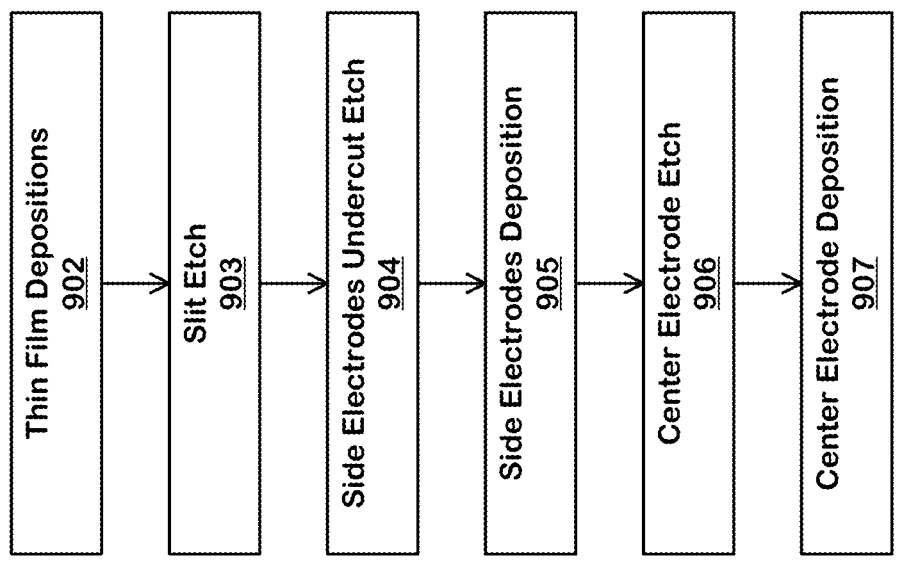
FIG. 9 illustrates a flow diagram for a technique to fabricate one or more regions of vertical 3D cross point memory elements.

Refer to Thin Film Depositions 902 of FIG. 9 and associated descriptive paragraphs for additional description relating to FIGS. 2A-2C.

The thin film depositions begin with deposition of a first separating layer (optionally a base layer) illustrated as Separation (Base) Layer 270. Next, the first of two alternating planar layers of materials is deposited (the instance of OTS Layer 252 adjacent to Separation (Base) Layer 270). Next, the second of the two alternating planar layers of materials is deposited (an instance of Separation Layer 256). Depositions of the alternating layers (OTS Layer 252 and Separation Layer 256) continue until a desired number of layers are deposited. As illustrated, the last layer deposited is an instance of OTS Layer 252.

In a variation, the last layer deposited is an instance of Separation Layer 256. Optionally, Separation (Base) Layer 270 is omitted and the first deposition of an instance of OTS Layer 252 is directly onto a substrate. In some variations, materials used and/or thicknesses thereof are identical for Separation (Base) Layer 270 and the instances of Separation Layer 256. In some variations, one or more of Separation (Base) Layer 270 and the instances of Separation Layer 256 are of varying materials and/or thicknesses.

Figures 3A, 3B, 3C:
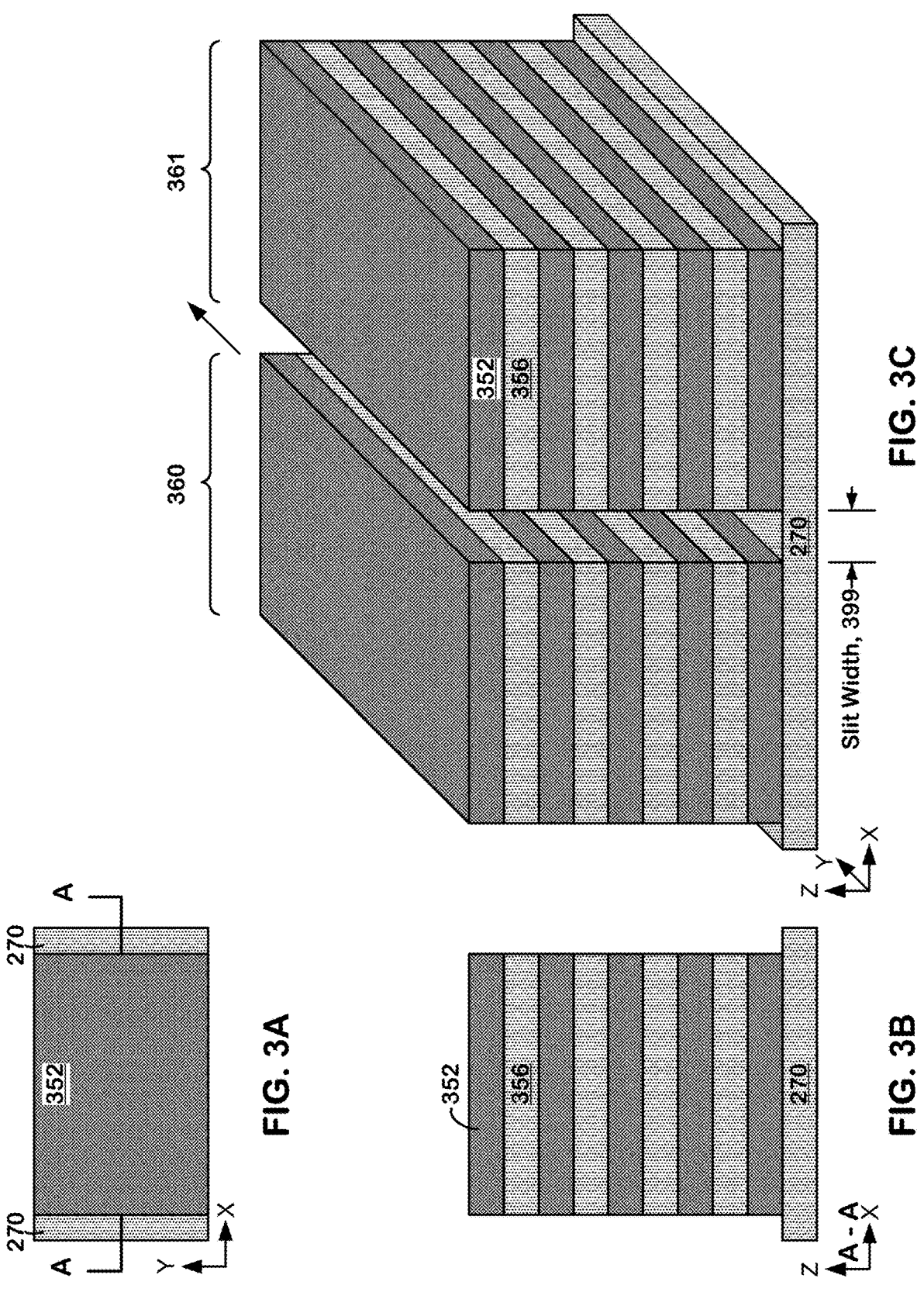

FIGS. 3A-3C illustrate various aspects of slits etched through the deposited thin film layers.

FIG. 3A illustrates a top view of the thin film depositions after the slits are etched. FIG. 3B illustrates a cross section view of elements of FIG. 3A along cross section A-A. FIG. 3C illustrates a 3D view corresponding to two instances of the elements of FIG. 3B as Slitted Group 360 and Slitted Group 361. Slitted Group 360 and Slitted Group 361 are formed into respective groups of unit cells, similar to Group of Unit Cells 104 of FIGS. 1A-1E.

In the top view, the entirety of Slitted OTS Layer 352 and the portions of Separation (Base) Layer 270 not obscured by Slitted OTS Layer 352 are visible.

In the cross section and 3D views, alternating active (Slitted OTS Layer 352) and separating (Slitted Separation Layer 356) layers are visible.

The slits are etched vertically, beginning at the uppermost of the alternating layers, continuing downward through the alternating layers, and ending at the boundary of the lowermost of the alternating layers, Separation (Base) Layer 270. The slits provide access for forming side electrodes and separation between groups of stacks of unit cells. The separation is characterized as a dimension, Slit Width 399. An example of the active layers after the slits are etched is Slitted OTS Layer 352, formed from OTS Layer 252 of FIGS. 2A-2C. An example of the separating layers after the slits are etched is Slitted Separation Layer 356, formed from Separation Layer 256 of FIGS. 2A-2C. Conceptually, Slitted Group 360 and Slitted Group 361 are formed from Deposited Layer Stack 260 of FIG. 2C via etching the slits.

With respect to FIGS. 2A-2C, Separation (Base) Layer 270 is unchanged.

Refer to Slit Etch 903 of FIG. 9 and associated descriptive paragraphs for additional description relating to FIGS. 3A-3C.

Figures 4A, 4B, 4C:
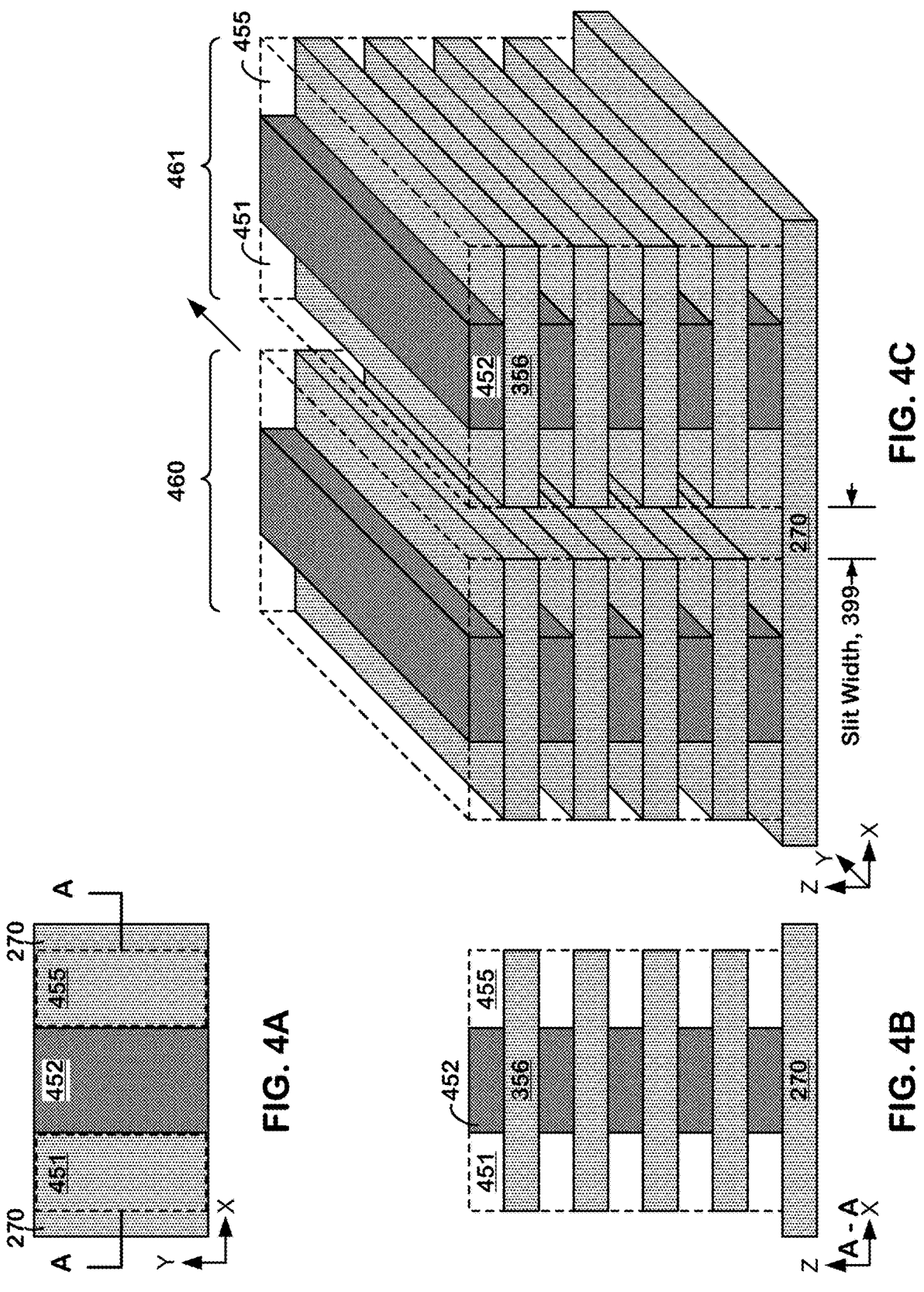

FIGS. 4A-4C illustrate various aspects of undercuts etched in the active layers.

FIG. 4A illustrates a top view of the thin film depositions after the undercuts are etched. FIG. 4B illustrates a cross section view of elements of FIG. 4A along cross section A-A. FIG. 4C illustrates a 3D view corresponding to two instances of the elements of FIG. 4B as Undercut Group 460 and Undercut Group 461.

In all the views, Undercut 451 and Undercut 455 are depicted as transparent with dashed-line outlines.

In the top view, the entirety of Undercut OTS Layer 452 and the portions of Separation (Base) Layer 270 not obscured by Undercut OTS Layer 452 are visible, as well as dashed-line outlines of Undercut 451 and Undercut 455. In the cross section and 3D views, alternating active (Undercut OTS Layer 452) and separating (Slitted Separation Layer 356) layers are visible, as well as dashed-line outlines of Undercut 451 and Undercut 455.

Undercut 451 and Undercut 455 are etched entirely along the major axis of the active layer. An example of the active layers after the undercuts are etched is Undercut OTS Layer 452, formed from Slitted OTS Layer 352 of FIGS. 3A-3C.

The following are unchanged with respect to FIGS. 3A-3C: Slitted Separation Layer 356, Slit Width 399, and Separation (Base) Layer 270.

Refer to Side Electrodes Undercut Etch 904 of FIG. 9 and associated descriptive paragraphs for additional description relating to FIGS. 4A-4C.

Figures 5A, 5B, 5C:
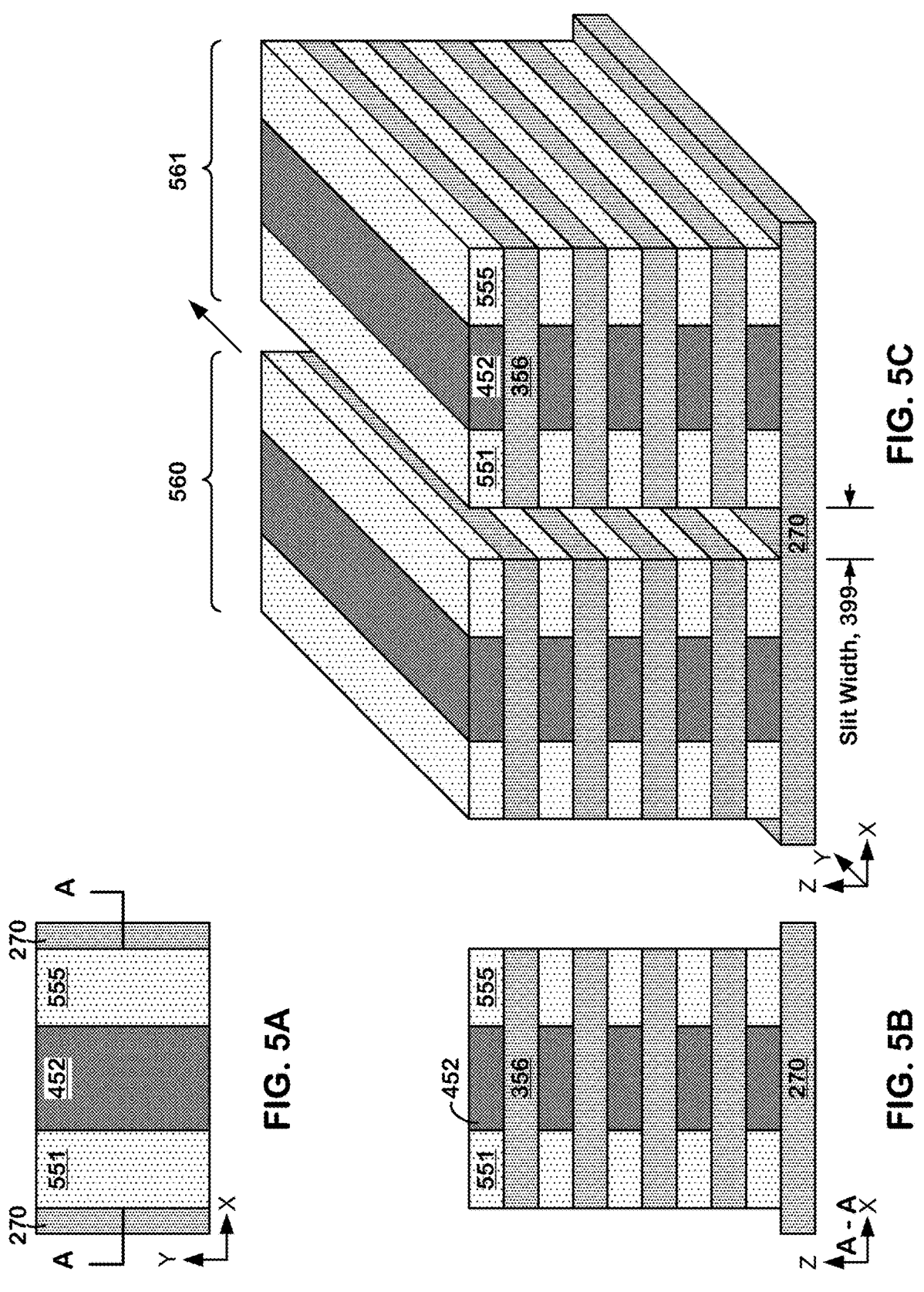

FIGS. 5A-5C illustrate various aspects of side electrodes formed by deposition of material in the undercuts.

FIG. 5A illustrates a top view of the thin film depositions after the side electrodes are deposited. FIG. 5B illustrates a cross section view of elements of FIG. 5A along cross section A-A. FIG. 5C illustrates a 3D view corresponding to two instances of the elements of FIG. 5B as Group with Outer Electrodes 560 and Group with Outer Electrodes 561.

In the top view, Left Electrode 551, Undercut OTS Layer 452, and Right Electrode 555 as well as portions of Separation (Base) Layer 270 not otherwise obscured are visible.

In the cross section and 3D views, alternating active (Left Electrode 551, Undercut OTS Layer 452, and Right Electrode 555) and separating (Slitted Separation Layer 356) layers are visible.

Material for the side electrodes is deposited to entirely fill the undercuts. An example of a pair of the side electrodes is Left Electrode 551 and Right Electrode 555 entirely filling respectively Undercut 451 and Undercut 455 of FIGS. 4B and 4C.

The following are unchanged with respect to FIGS. 4A-4C: Undercut OTS Layer 452, Slitted Separation Layer 356, Slit Width 399, and Separation (Base) Layer 270.

Refer to Side Electrodes Deposition 905 of FIG. 9 and associated descriptive paragraphs for additional description relating to FIGS. 5A-5C.

Figures 6A, 6B, 6C:
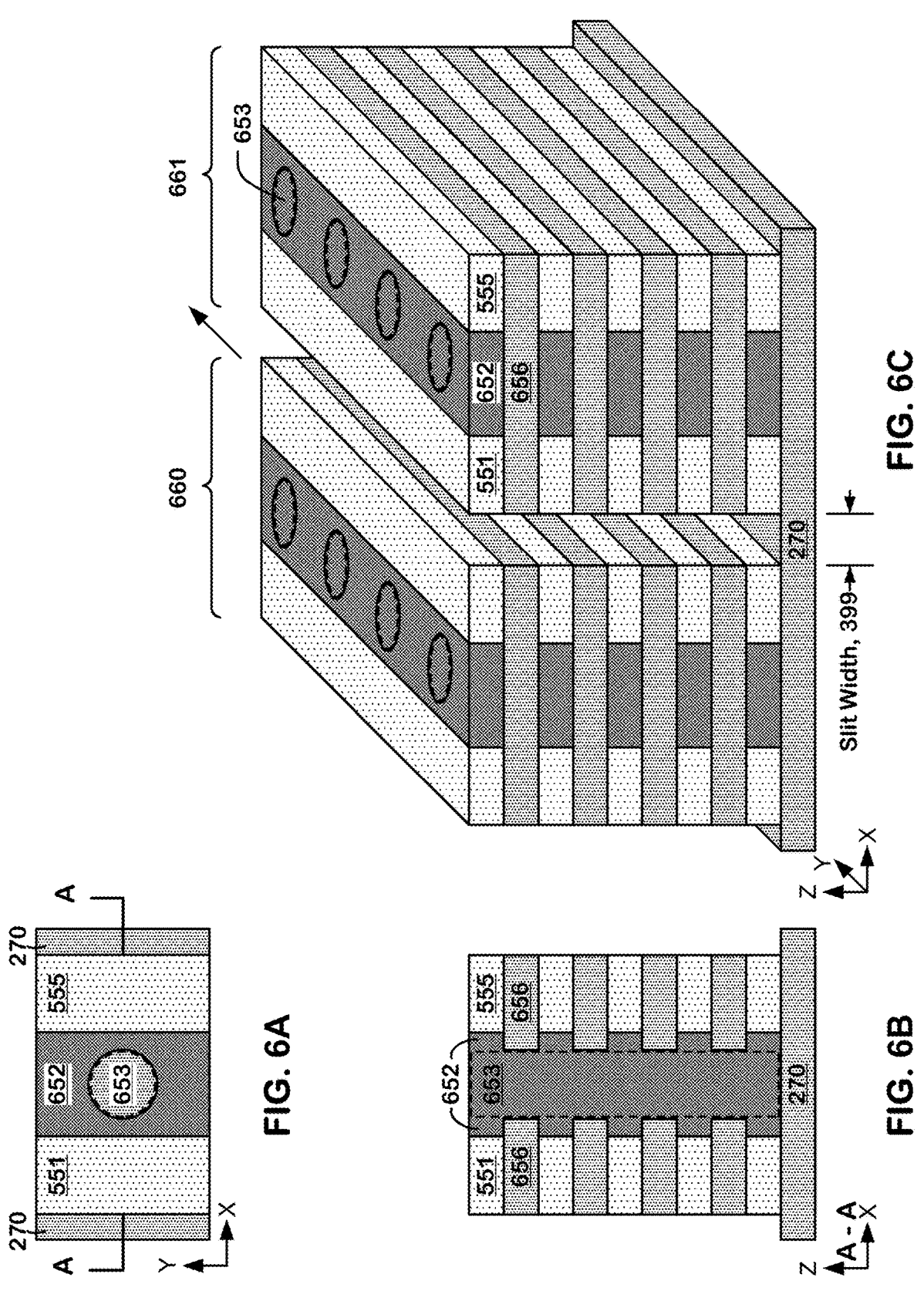

FIGS. 6A-6C illustrate various aspects of holes etched though the deposited and subsequently processed thin film layers.

FIG. 6A illustrates a top view of the thin film depositions after the holes are etched. FIG. 6B illustrates a cross section view of elements of FIG. 6A along cross section A-A. FIG. 6C illustrates a 3D view corresponding to two instances of the elements of FIG. 6B as Group Ready for Center Electrodes 660 and Group Ready for Center Electrodes 661.

In all the views, Hole for Center Electrode 653 is depicted as transparent with dashed-line outlines.

In the top view, Left Electrode 551, Completed OTS Layer 652, Right Electrode 555, and Hole for Center Electrode 653 as well as portions of Separation (Base) Layer 270 not otherwise obscured are visible. In the cross section and 3D views, alternating active (Left Electrode 551, Completed OTS Layer 652, and Right Electrode 555) and separating (Completed Separation Layer 656) layers are visible. Hole for Center Electrode 653 is depicted as transparent with dashed-line outlines.

An example of one of the holes is Hole for Center Electrode 653. An example of one of the active layers after the holes are etched is Completed OTS Layer 652, formed from Undercut OTS Layer 452 of FIGS. 4A-4C. An example of one of the separation layers after the holes are etched is Completed Separation Layer 656, formed from Slitted Separation Layer 356 of FIGS. 3B and 3C.

The following are unchanged with respect to FIGS. 5A-5C: Left Electrode 551, Right Electrode 555, Slit Width 399, and Separation (Base) Layer 270.

Thus, after the holes are etched, instances of Completed OTS Layer 652 and instances of Completed Separation Layer 656 have respective internal sidewalls that collectively define instances of Hole for Center Electrode 653.

Refer to Center Electrode Etch 906 of FIG. 9 and associated descriptive paragraphs for additional description relating to FIGS. 6A-6C.

FIGS. 7A-7C illustrate various aspects of center electrodes formed by deposition of material in the holes. Thus, as illustrated by FIGS. 2A-7C, a plurality of vertical 3D cross point memory elements is formed.

FIG. 7A illustrates a top view of the thin film depositions after the center electrodes are deposited in the holes. FIG. 7B illustrates a cross section view of elements of FIG. 7A along cross section A-A. FIG. 7C illustrates a 3D view corresponding to two instances of the elements of FIG. 7B as Completed Group 760 and Completed Group 761.

In the top view, Left Electrode 551, Completed OTS Layer 652, Right Electrode 555, and Center Electrode 753 as well as portions of Separation (Base) Layer 270 not otherwise obscured are visible.

In the cross section and 3D views, alternating active (Left Electrode 551, Completed OTS Layer 652, Center Electrode 753, and Right Electrode 555) and separating (Completed Separation Layer 656) layers are visible.

Material for the center electrodes is deposited to entirely fill the holes. An example of one of the center electrodes is Center Electrode 753 entirely filling Hole for Center Electrode 653 of FIGS. 6A-6C.

The following are unchanged with respect to FIGS. 6A-6C: Completed OTS Layer 652, Completed Separation Layer 656, Left Electrode 551, Right Electrode 555, Slit Width 399, and Separation (Base) Layer 270.

Thus, after deposition of the center electrodes in the holes, at least a portion of Completed OTS Layer 652 is electrically in series between Left Electrode 551 and Center Electrode 753, corresponding, e.g., to Left Cell 110L of FIG. 1A. Further, at least a portion of Completed OTS Layer 652 is electrically in series between Right Electrode 555 and Center Electrode 753, corresponding, e.g., to Right Cell 110R of FIG. 1A.

Refer to Center Electrode Deposition 907 of FIG. 9 and associated descriptive paragraphs for additional description relating to FIGS. 7A-7C.

Vertical 3D Cross Point Memory Hybrid Electrodes

Some vertical 3D cross point memories are fabricated with hybrid electrodes. Each of the hybrid electrodes is formed from two structures, each structure with respective material compositions and geometries. The two structures of each electrode are physically adjacent to each other in two dimensions, and collectively operate as a respective hybrid electrode. Conceptually, compared to fabrication without hybrid electrodes, fabrication with hybrid electrodes results in a buffer structure disposed between a non-hybrid electrode and a controllable conduction element, e.g., a portion of the hybrid electrode is of a conductive material and is separated from the controllable conduction element by a portion of the hybrid electrode that is of a buffer material.

Figures 8A, 8B, 8C:
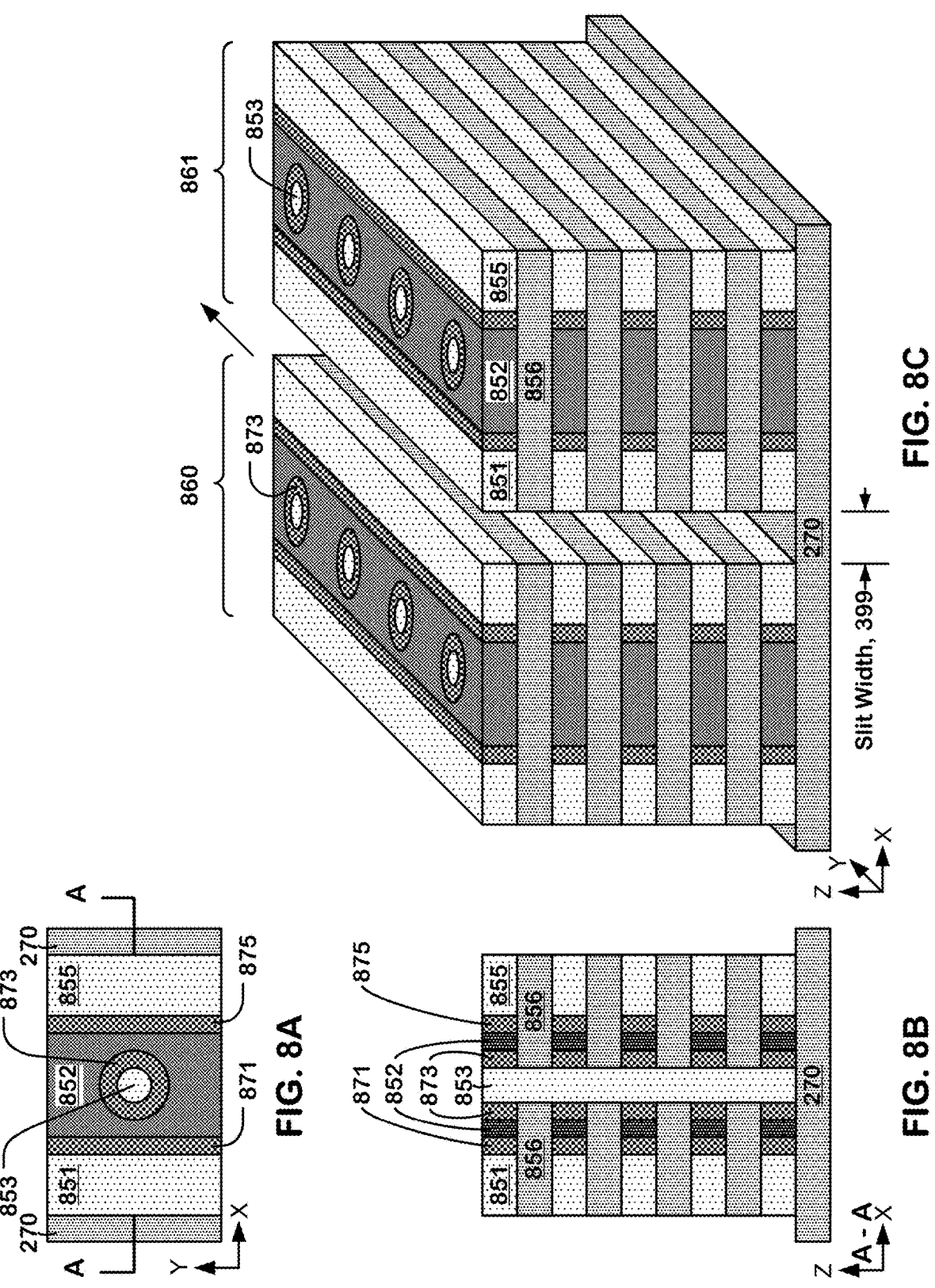
FIGS. 8A, 8B, and 8C illustrate an alternate example of fabrication of vertical 3D cross point memory elements, the alternate example having hybrid electrodes.

FIGS. 8A-8C illustrate an alternate example of fabrication of vertical 3D cross point memory elements, the alternate example having hybrid electrodes. Two groups of stacks of unit cells are illustrated as Group 860 and Group 861.

Compared to FIGS. 7A-7C, the hybrid electrodes of FIGS. 8A-8C are formed from two structures, rather than a single structure. The electrodes Left Electrode (second material) 871, Center Electrode (second material) 873, and Right Electrode (second material) 875 in combination respectively with Left Electrode (first material) 851, Center Electrode (first material) 853, and Right Electrode (first material) 855 are respectively referred to as hybrid electrodes. Left Electrode (first material) 851 and Left Electrode (second material) 871 collectively form a left hybrid electrode similar in function to Left Electrode 551 of FIGS. 7A-7C. Similarly, Right Electrode (first material) 855 and Right Electrode (second material) 875 collectively form a hybrid electrode similar in function to Right Electrode 555 of FIGS. 7A-7C. Center Electrode (first material) 853 and Center Electrode (second material) 873 collectively form a hybrid electrode similar in function to Center Electrode 753 of FIGS. 7A-7C.

In some respects, elements Left Electrode (first material) 851, Center Electrode (first material) 853, and Right Electrode (first material) 855 of FIGS. 8A-8C respectively conceptually correspond to elements Left Electrode 551, Center Electrode 753, and Right Electrode 555 of FIGS. 7A-7C. For example, Left Electrode (first material) 851 and Right Electrode (first material) 855 are of identical composition and geometry as Left Electrode 551 and Right Electrode 555. Further, Center Electrode (first material) 853 is of identical composition and geometry as Center Electrode 753. For another example, Left Electrode (first material) 851, Center Electrode (first material) 853, and Right Electrode (first material) 855 are respectively of identical composition but different geometry compared to Left Electrode 551, Center Electrode 753, and Right Electrode 555. E.g., the minor dimensions (along the X-axis) of Left Electrode (first material) 851 and Right Electrode (first material) 855 is less than the corresponding dimensions of Left Electrode 551 and Right Electrode 555, and the diameter of Center Electrode (first material) 853 is less than that of Center Electrode 753. For another example, Left Electrode (first material) 851, Center Electrode (first material) 853, and Right Electrode (first material) 855 are comprised of a W-based material, and Left Electrode (second material) 871, Center Electrode (second material) 873, and Right Electrode (second material) 875 are comprised of a C-based material.

OTS Layer 852 of FIGS. 8A-8C conceptually corresponds to Completed OTS Layer 652 of FIGS. 7A-7C. For example, OTS Layer 852 is of an identical composition as Completed OTS Layer 652. For another example, the minor dimension (along the X-axis) of OTS Layer 852 is less than the corresponding dimension of Completed OTS Layer 652.

Separation Layer 856 of FIGS. 8A-8C conceptually corresponds to Completed Separation Layer 656 of FIGS. 7A-7C. For example, Separation Layer 856 is of identical dimensions and/or composition as Completed Separation Layer 656.

Separation (Base) Layer 270 and Slit Width 399 of FIGS. 8A-8C respectively correspond to identically numbered elements of FIGS. 7A-7C.

Vertical 3D Cross Point Memory Example Fabrication Flow

Devices comprising vertical 3D cross point memory are manufactured, for example, from a wafer, such as a semiconductor (e.g., silicon) wafer. The wafer has a top surface compatible with fabrication via processing across the entirety of the top surface of the wafer. The fabrication is performable in a semiconductor fabrication facility. The processing forms one or more regions of vertical 3D cross point memory elements and optionally forms other regions. The other regions optionally comprise circuitry to use the vertical 3D cross point memory elements as a memory device, such as one or more processors, interfaces, and/or circuitry enabled to interoperate with memories. The other regions optionally comprise circuitry to use a vertical 3D cross point memory device in a system and/or elements of the system itself.

FIG. 9 illustrates a flow diagram for a technique to fabricate one or more regions of vertical 3D cross point memory elements, such as illustrated in any of the preceding figures.

The operations comprise deposition and etching of materials to form the vertical 3D cross point memory. The etching is guided, for example, by use of one or more masks, such as a photomask. The etching optionally comprises intermediate actions of depositing a layer of photo-sensitive material that is selectively removed (or retained) based on selective exposure of the photo-sensitive material to electromagnetic radiation (e.g., ultraviolet light) via the photomask. Different photomasks are used for different actions illustrated in the figure. For clarity, in the following description relating to the figure, specific mentions of photomasks are omitted.

The processing begins with depositing a plurality of alternating planar thin film layers (Thin Film Depositions 902) such as instances of Separation (Base) Layer 270, OTS Layer 252, and Separation Layer 256 of FIGS. 2A-2C. The thin film layers alternate in pairs of a separating layer and an active layer. The first deposition (e.g., Separation (Base) Layer 270 of FIGS. 2A-2C) covers at least substantially the entirety of the regions of the top surface of the wafer that are to become vertical 3D cross point memory elements. The second deposition (e.g., OTS Layer 252 adjacent to Separation (Base) Layer 270 of FIGS. 2A-2C) covers at least substantially the entirety of the top surface of the first deposition, and so forth. Separating layers (corresponding to the first deposition, third deposition, and so forth) serve to separate (e.g., electrically and/or thermally) the active layers from each other. The separating layers are optionally comprised of a same material, e.g., a particular dielectric, such as Silicon Nitride (e.g., as Si3N4 and/or SiN) or Silicon Dioxide. Active layers (corresponding to the second deposition, fourth deposition, and so forth) serve to form a portion of active circuitry of the vertical 3D cross point memory elements. The active layers are optionally comprised of a same material, e.g., a particular OTS material, such as a chalcogenide comprising Te. Depositions continue until a target number of layers are deposited, e.g., 8, 32, 64, 1024 layers (corresponding to 4, 16, 32, and 512 pairs of layers) are formed.

The thin film depositions are performable using CVD.

Then the processing proceeds to etch a plurality of parallel slits through the deposited thin film layers (Slit Etch 903) such as illustrated by Slit Width 399 of FIGS. 3A-3C. The slits are to provide access for etching and deposition for side electrodes as well as to provide separation between groups of stacks of unit cells. The slit etching is directional and performable via RIE techniques.

Then the processing proceeds to etch an undercut in each of the active layers (Side Electrodes Undercut Etch 904) such as illustrated by Undercut 451 and Undercut 455 of FIGS. 4A-4C. The undercuts are for subsequent deposition of material for side electrodes. The undercut etching is performable using wet or dry etching techniques. The extension of the undercut is controllable by controlling etch time.

Then the processing proceeds to deposit material to form the side electrodes (Side Electrodes Deposition 905) such as illustrated by Left Electrode 551 and Right Electrode 555 of FIGS. 5A-5C. The side electrode deposition is performable via ALD techniques. In some variations, the side electrode deposition results in deposition of material in the slits that is removable via RIE techniques.

Then the processing proceeds to etch a hole for subsequent deposition of material to form center electrodes (Center Electrode Etch 906) such as illustrated by Hole for Center Electrode 653 of FIGS. 6A-6C. The holes are for subsequent deposition of material for center electrodes. The hole etching is performable via RIE techniques. In some variations, an etching stop layer is used to determine the depth of the hole etching, e.g., to prevent etching too deeply.

Then the processing proceeds to deposit material to form the center electrodes (Center Electrode Deposition 907) such as illustrated by Center Electrode 753 of FIGS. 7A-7C. The center electrode deposition is performable via CVD techniques. Center Electrode 753 is optionally processed by CMP processing after the center electrode deposition.

Thus, the processing for fabricating the vertical 3D cross point memory elements is complete.

In variations having hybrid electrodes, etching relating to side electrode deposition as well as center electrode deposition proper are in accordance with hybrid electrode formation. For side hybrid electrodes, Side Electrodes Undercut Etch 904 performs sufficient etching to subsequently deposit hybrid electrode materials to form two structures, such as illustrated by Left Electrode (first material) 851 and Left Electrode (second material) 871 collectively in FIGS. 8A-8C, or alternatively Right Electrode (first material) 855 and Right Electrode (second material) 875 collectively of the same figures. Side Electrodes Deposition 905 performs deposition of two materials to form the two structures of the side hybrid electrodes. Similarly, for hybrid center electrodes, Center Electrode Etch 906 performs sufficient etching to subsequently deposit hybrid electrode materials to form two structures, such as illustrated by Center Electrode (first material) 853 and Hole for Center Electrode 653 collectively in FIGS. 8A-8C. Center Electrode Deposition 907 performs deposition of the two materials to form the two structures of the center hybrid electrodes.

The deposition of the two materials to from the side and center hybrid electrodes proceeds similarly for Side Electrodes Deposition 905 and Center Electrode Deposition 908. The deposition of the two materials proceeds serially. The first of the two serially deposited materials comprises, for example, C. The second of the two serially deposited materials comprises, for example, material identical to that of non-hybrid electrodes, such as W. In some variations, no additional lithography (e.g., use of a photomask) is used for formation of hybrid electrodes (etching and deposition) compared to formation of non-hybrid electrodes.

In some fabrication flows, additional processing precedes, follows, and/or is wholly or partially concurrent with any one or more of the actions illustrated in FIG. 9. For example, the additional processing is for circuitry related to using the vertical 3D cross point memory elements as a memory device, using the memory device in a system, and/or forming one or more components of the system. As a specific example, in some integrated circuit fabrication flows, planarizing is performed after the deposition of material in the holes, such as to provide a surface suitable to form additional elements. The planarizing, e.g., fills the slit between Completed Group 760 and Completed Group 761 of FIGS. 7A-7C. The planarizing enables formation of circuitry, for example, to form other elements of a system, such as one or more processors, interfaces, and/or circuitry enabled to interoperate with memories. As another specific example, in some integrated circuit fabric flows, the center electrode extends beyond a base layer, e.g., as illustrated in FIGS. 1C-1E.

Vertical 3D Cross Point Memory Center Electrodes

Center electrodes with various cross sections are usable in vertical 3D cross point memories. Examples include a circular cross section, an elliptical cross section, and a rectangular cross section.

Figure 10:
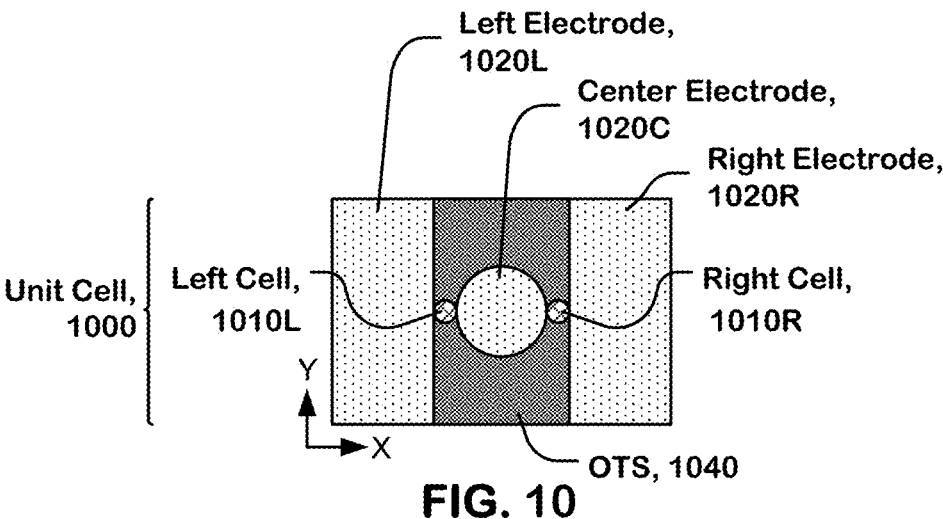
FIGS. 10, 11, and 12 illustrate example center electrodes.
Figure 11:
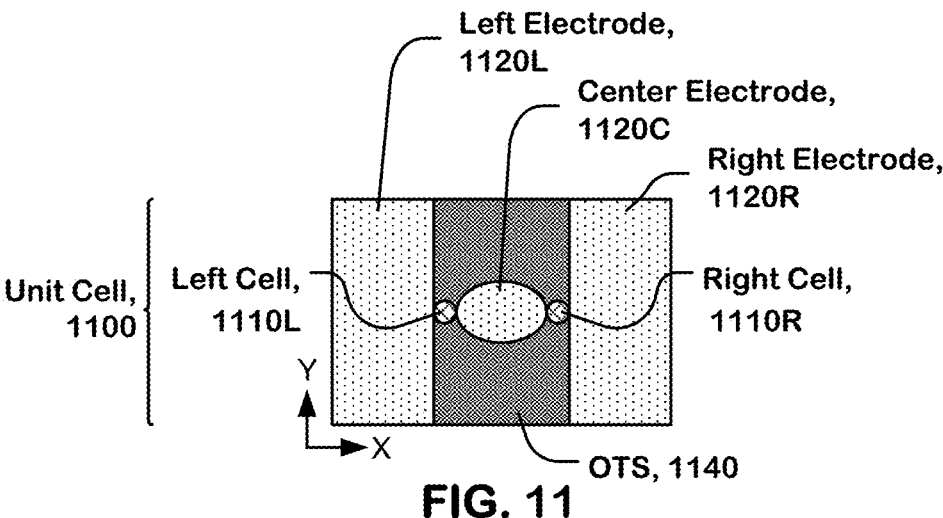
Figure 12:
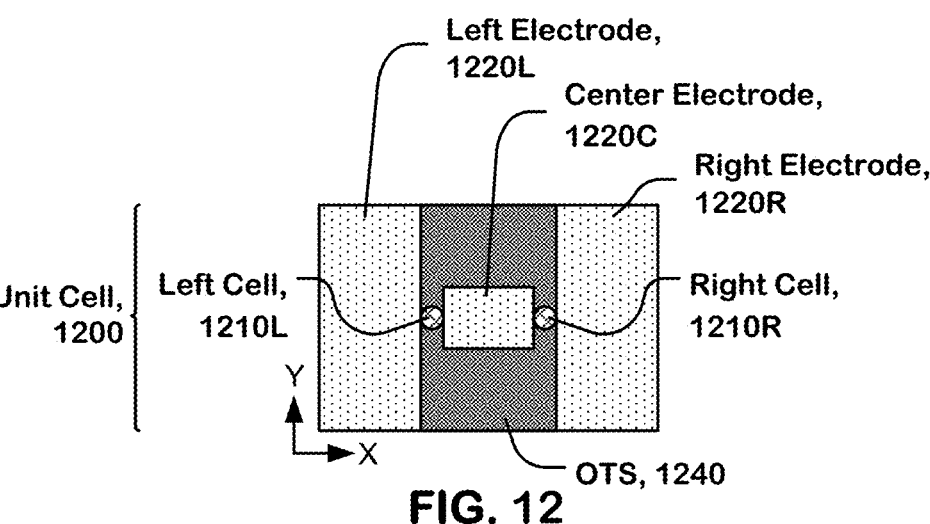

FIGS. 10, 11, and 12 illustrate example center electrodes in respective top views (e.g., in the X and Y dimensions).

FIG. 10 illustrates an example center electrode having a circular cross section, as Center Electrode 1020C. In some cases, Unit Cell 1000 corresponds to an example of Unit Cell 100 of FIGS. 1A and 1B. For instance, Unit Cell 1000, Left Cell 1010L, Right Cell 1010R, Center Electrode 1020C, Left Electrode 1020L, Right Electrode 1020R, and OTS 1040 of FIG. 10 correspond respectively to Unit Cell 100, Left Cell 110L, Right Cell 110R, Center Electrode 120C, Left Electrode 120L, Right Electrode 120R, and OTS 140 of FIGS. 1A and 1B. In some cases, Unit Cell 1000 differs from Unit Cell 100, such as differing dimensions, compositions, and/or formation techniques of one or more of the illustrated elements.

FIG. 11 illustrates an example center electrode having an elliptical cross section, as Center Electrode 1120C. In some cases, Unit Cell 1100 is a variation of Unit Cell 100 of FIGS.

1A and 1B, differing only in center electrode shape. For instance, Unit Cell 1100, Left Cell 1110L, Right Cell 1110R, Center Electrode 1120C, Left Electrode 1120L, Right Electrode 1120R, and OTS 1140 of FIG. 11 correspond respectively to Unit Cell 100, Left Cell 110L, Right Cell 110R, Center Electrode 120C, Left Electrode 120L, Right Electrode 120R, and OTS 140 of FIGS. 1A and 1B. In some cases, Unit Cell 1100 differs from Unit Cell 100, such as differing dimensions, compositions, and/or formation techniques of one or more of the illustrated elements.

FIG. 12 illustrates an example center electrode having a rectangular cross section, as Center Electrode 1220C. In some cases, Unit Cell 1200 is a variation of Unit Cell 100 of FIGS. 1A and 1B, differing only in center electrode shape. For instance, Unit Cell 1200, Left Cell 1210L, Right Cell 1210R, Center Electrode 1220C, Left Electrode 1220L, Right Electrode 1220R, and OTS 1240 of FIG. 12 correspond respectively to Unit Cell 100, Left Cell 110L, Right Cell 110R, Center Electrode 120C, Left Electrode 120L, Right Electrode 120R, and OTS 140 of FIGS. 1A and 1B. In some cases, Unit Cell 1200 differs from Unit Cell 100, such as differing dimensions, compositions, and/or formation techniques of one or more of the illustrated elements.

Vertical 3D Cross Point Memory Group Arrangements

Figures 13, 14:
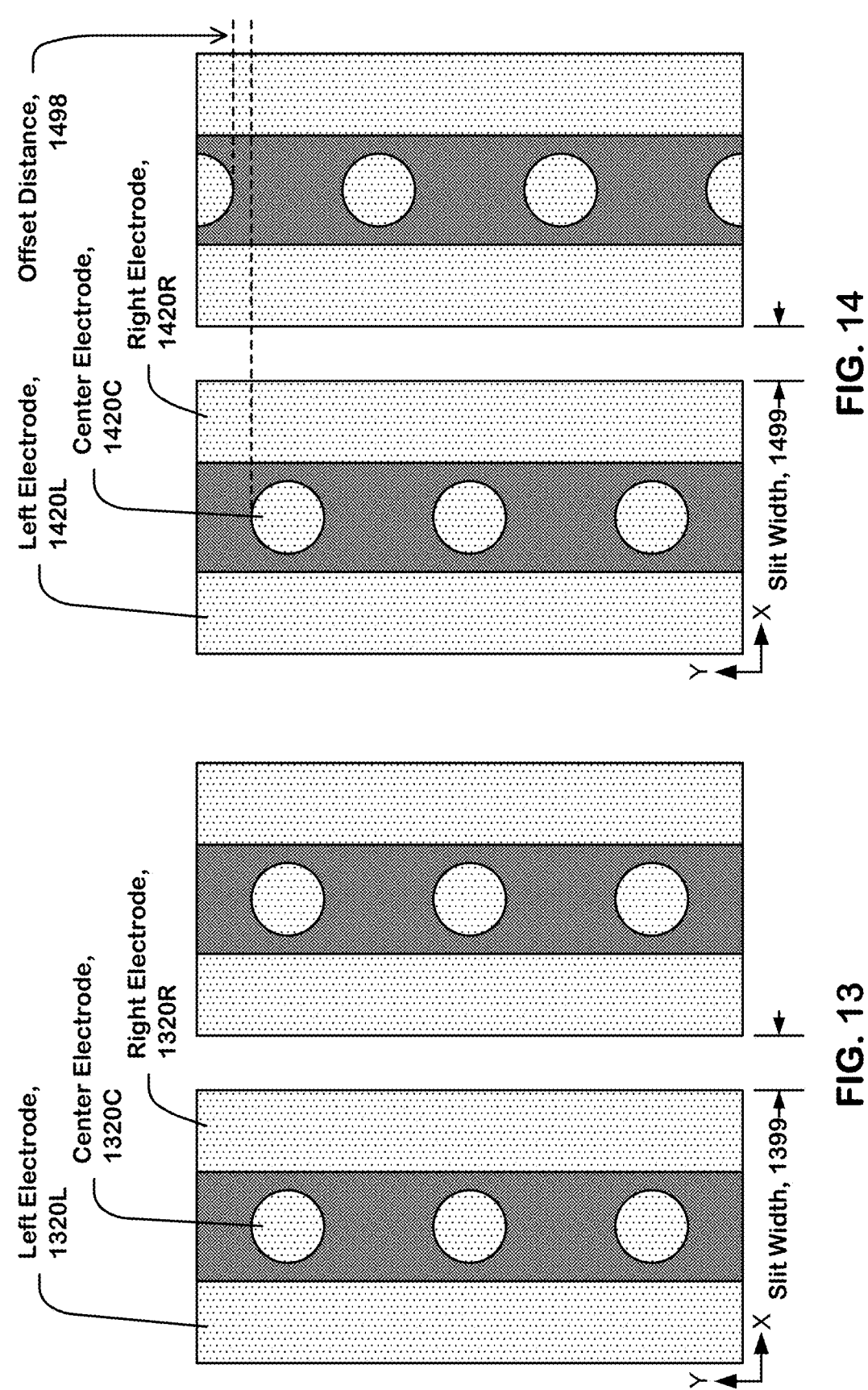
FIGS. 13 and 14 illustrate example arrangements of groups of memory cells.

FIGS. 13 and 14 illustrate example arrangements of groups of memory cells.

FIG. 13 illustrates a top view of a first example arrangement of groups of memory cells. The groups are replicated in the X dimension separated by Slit Width 1399. Center electrodes (instances of Center Electrode 1320C) are aligned to each other.

FIG. 14 illustrates a top view of a second example arrangement of groups of memory cells. The groups are replicated in the X dimension separated by Slit Width 1499. Center electrodes (instances of Center Electrode 1420C) are offset with respect to each other by Offset Distance 1498. The second example arrangement is sometimes referred to as a "twist" array.

Left Electrode 1320L and Left Electrode 1420L are analogous, e.g., to Left Electrode 120L of FIG. 1A. Right Electrode 1320R and Right Electrode 1420R are analogous, e.g., to Right Electrode 120R of FIG. 1A. Center Electrode 1320C and Center Electrode 1420C are analogous, e.g., to Center Electrode 120C of FIG. 1A.

Vertical 3D Cross Point Memory Materials

Suitable materials for forming electrodes (e.g., left, right, and/or center electrodes) include W, Ta, Ti, TiN, TaN, and C singly, in any combination with each other, or serving as a basis of a material formulated in combination with one or more other materials. In various fabrication flows, any combination of electrodes such as those illustrated in FIGS. 7A-7C and 8A-8C are fabricated from the suitable electrode materials. In one example, all the electrodes are fabricated from one of the suitable electrode materials, such as W. In another example, all the electrodes are fabricated from a combination of two or more of the suitable electrode materials. In another example, some of the electrodes are fabricated from a first combination of two or more of the suitable electrode materials, and others of the electrodes are fabricated from a second combination of two or more of the suitable electrode materials. In another example, left and right electrodes are fabricated from a first one or more of the suitable electrode materials, and center electrodes are fabricated from a second one or more of the suitable electrode materials.

Suitable materials for forming hybrid electrode elements include the suitable electrode materials usable as a first material to form a first portion of the electrode in combination with a second material to form a second portion of the electrode that is disposed between the first portion and an OTS element. For example, the first portion of the hybrid electrode is comprised of a W-based material and the second portion of the hybrid electrode is comprised of a C-based material.

Suitable materials for controllable conduction materials (such as OTS layers and/or elements formed therefrom) include As, Se, Si, Ge, Sb, Te, and In singly, in any combination with each other, or serving as a basis of a material formulated in combination with one or more other materials. For a first set of examples, suitable OTS materials include a compound comprising any combination of As, Se, and Ge. Optionally the compound is doped with one or more elements selected from a group comprising In, Si, S, B, C, N, and Te. For a second set of examples, suitable OTS materials include one or more elements from a group comprising As, Te, Sb, Se, Ge, Si, 0, and N. In various fabrication flows, any combination of controllable conduction materials such as those illustrated in FIGS. 7A-7C and 8A-8C are fabricated from the suitable controllable conduction materials. For example, all the OTS elements are fabricated from a chalcogenide comprising Te.

Suitable materials for separation layers include one or more dielectric materials such as Silicon Nitride (e.g., as Si3N4 and/or SiN) or Silicon Dioxide. In various fabrication flows, any combination of separation layers such as those illustrated in FIGS. 7A-7C and 8A-8C are fabricated from the separation layer materials.

Vertical 3D Cross Point Memory Devices and Systems

Some devices (e.g., integrated circuits, one or more die of a system-on-a-chip, and/or packaged die) comprise one or more vertical 3D cross point memory cell arrays with additional circuitry to implement a memory device usable as a stand-alone device and/or usable as a component in a system. The additional circuitry provides interface and control functions to enable the vertical 3D cross point memory cell arrays to appear variously organized as one or more planes, each plane comprising one or more blocks, each block comprising one or more pages, and each page comprising one or more memory stages (e.g., bit strings). As a first specific example of a function performed by the additional circuitry, bipolar box pulses, e.g., of 10-50 ns duration and a magnitude lower than the effective Vt of a highest Vt of a memory cell, are generated by the additional circuitry to read the memory cell. As a second specific example of a function performed by the additional circuitry, bipolar box pulses, e.g., of 10-50 ns duration and a magnitude of 1-10V, are generated by the additional circuitry to program the memory cell.

The additional circuitry variously comprises hardware circuitry blocks such as bit line circuitry, sense amplifiers, page caches/buffers, interface circuitry, word line decoders/drivers, controllers, and/or bias circuitry (such as voltage and/or current sources).

Vertical 3D Cross Point Memory Additional Information

FIGS. 1A-14 disclose example vertical 3D cross point memories that provide non-volatile storage by using a controlled conductivity layer such as comprised of an OTS material. Other example vertical 3D cross point memories provide non-volatile storage by using other techniques, such as PCM and/or SONOS. Other example vertical 3D cross point memories provide volatile storage by using dynamic charge storage techniques.

In various example systems, vertical 3D cross point memories are used to implement various combinations of SCM, NVDIMM components, CXL memory, SSDs, and/or DRAM-like storage.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
a center electrode;
a stack of layers having an internal sidewall that defines a hole that accommodates the center electrode; and
wherein the stack of layers comprises active layers,
wherein each of the active layers comprises a left electrode, a controllable conduction element, and a right electrode, and
wherein at least a portion of the controllable conduction element is in electrical series between (i) the left electrode and the center electrode and (ii) the right electrode and the center electrode.

2. The memory device of claim 1, wherein:
the stack of layers further comprises one or more separating layers; and
the active layers are separated from each other by at least one of the separating layers.

3. The memory device of claim 2, wherein:
the center electrode is a first center electrode;
the memory device further comprises a second center electrode;
the internal sidewall is a first internal sidewall, the hole is a first hole, and the stack of layers has a second internal sidewall that defines a second hole that accommodates the second center electrode; and
the at least the portion of the controllable conduction element is in electrical series between (i) the left electrode and the second center electrode and (ii) the right electrode and the second center electrode.

4. The memory device of claim 3, wherein there are at least three of the active layers.

5. The memory device of claim 4, wherein:
the stack of layers is a first stack of layers;
the memory device further comprises a second stack of layers like the first stack of layers; and
the first and the second stacks of layers are physically separated from each other.

6. The memory device of claim 5, wherein:
the layers of the first and second stacks of layers are parallel to each other; and
a major axis of the first center electrode and a major axis of the second center electrode are orthogonal to a plane that the layers of the first and second stacks of layers are parallel with.

7. The memory device of claim 1, wherein:
the controllable conduction elements comprise Ovonic Threshold Switch (OTS) material;
the left electrodes and the right electrodes comprise a first conductive material; and
the center electrode comprises a second conductive material.

8. The memory device of claim 1, wherein:

the left electrodes and the right electrodes are collectively side electrodes that comprise respective conductive portions comprised of a first conductive material;

the center electrode comprises a conductive portion comprised of a second conductive material;

the side electrodes and the center electrode are collectively memory electrodes;

at least one of the memory electrodes further comprises a buffer portion comprising a buffer material; and the buffer portion of the at least one memory electrode is disposed between the conductive portion of the at least one memory electrode and at least one of the controllable conduction elements.

9. The memory device of claim 1, wherein:

the left electrodes, the right electrodes, and the center electrode are collectively memory electrodes; and at least one of the memory electrodes is formed of a material comprising any combination of tungsten (W) and carbon (C).

10. The memory device of claim 1, wherein:

the stack of layers comprises two like stacks of layers having major axes parallel to each other, and each of the two like stacks of layers have respective pluralities of center electrodes respectively comprising the center electrode of the respective like stack of layers;

the two like stacks of layers are physically separated from each other;

the plurality of center electrodes of a first of the two like stacks of layers is offset along the major axis of the first of the two like stacks of layers with respect to the plurality of center electrodes of a second of the two like stacks of layers.

11. The memory device of claim 1, wherein:

the left electrodes and the right electrodes are collectively each operable as a respective word line of a memory array;

the center electrode is operable as a bit line of the memory array; and the controllable conduction elements are usable as non-volatile storage to store portions of information of the memory array, the information is resolvable to one or more bits of binary information, and is accessible via activation of one of the word lines in conjunction with operation of the bit line.

12. A method of forming a memory device, the method comprising:

forming a stack of layers, the stack of layers comprising alternating active layers and separating layers; and forming a conductive center electrode vertically extending through the stack of layers, wherein the forming the stack of layers includes forming each of the active layers by:

forming a layer of controllable conduction material;

forming a pair of parallel undercuts in the layer of controllable conduction material; and forming a pair of conductive side electrodes to fill the parallel undercuts and wherein the conductive side electrodes are separated from the conductive center electrode by at least a portion of the layer of controllable conduction material.

13. The method of claim 12, wherein:

the conductive center electrode is a first conductive center electrode;

the method further comprises forming a second conductive center electrode vertically extending through the stack of layers; and each pair of the conductive side electrodes is separated from the second conductive center electrode by at least a portion of the layer of controllable conduction material.

14. The method of claim 13, further comprising forming a plurality of vertical slits extending through the stack of layers, and wherein the vertical slits are parallel to each other.

15. The method of claim 12, wherein the forming the conductive center electrode comprises forming a buffer structure disposed between the conductive center electrode and the layer of controllable conduction material.

16. The method of claim 12, wherein the forming the pair of conductive side electrodes comprises forming a buffer structure disposed between at least one of the conductive side electrodes and the layer of controllable conduction material.

17. The method of claim 12, wherein:

the conductive center electrode has a particular one of a plurality of cross sections parallel to a plane that the layers of the stack of layers are parallel with; and the plurality of cross sections comprises at least one of a circular cross section, an elliptical cross section, and a rectangular cross section.

18. The method of claim 12, further comprising:

forming a plurality of conductive center electrodes that comprises the conductive center electrode; and wherein the conductive center electrodes of the plurality of conductive center electrodes are arranged in alternating columns offset from each other by a predetermined offset.

19. The method of claim 12, wherein the layer of controllable conduction material comprises Ovonic Threshold Switch (OTS) material.

20. The method of claim 12, wherein:

the conductive center electrode and the conductive side electrodes are collectively memory electrodes; and at least one of the memory electrodes is formed of a material comprising any combination of tungsten (W) and carbon (C).

* * * * *